United States Patent [19]

Okino

[11] Patent Number: 5,700,604
[45] Date of Patent: Dec. 23, 1997

[54] CHARGED PARTICLE BEAM EXPOSURE METHOD AND MASK EMPLOYED THEREFOR

[75] Inventor: Teruaki Okino, Kanagawa-ken, Japan

[73] Assignee: Nikon Corporation, Tokyo, Japan

[21] Appl. No.: 607,315

[22] Filed: Feb. 26, 1996

[30] Foreign Application Priority Data

Mar. 1, 1995 [JP] Japan ................................. 7-042054

[51] Int. Cl.$^6$ .................................................. G03F 9/00
[52] U.S. Cl. .................. 430/5; 430/296; 430/311
[58] Field of Search .................. 430/5, 296, 311, 430/312

[56] References Cited

U.S. PATENT DOCUMENTS

| | | |
|---|---|---|
| 5,079,112 | 1/1992 | Berger et al. . |
| 5,082,762 | 1/1992 | Takahashi ................ 430/296 |
| 5,130,213 | 7/1992 | Berger et al. . |
| 5,432,714 | 7/1995 | Chung et al. ............ 430/296 |

Primary Examiner—S. Rosasco
Attorney, Agent, or Firm—Armstrong, Westerman, Hattori, McLeland & Naughton

[57] ABSTRACT

A charged particle beam exposure method capable of suppressing the degradation of dimensional accuracy of exposed pattern elements due to the proximity effect and Coulomb effect defocusing. The charged particle beam exposure method is a method in which a charged particle beam is irradiated to a mask to transfer an image of a pattern formed on the mask onto a radiation-sensitive substrate. The method includes dividing one exposed pattern element which is to be formed on the radiation-sensitive substrate into a plurality of regions including a region lying at a marginal portion of the exposed pattern element and at least one other region lying inside the marginal portion, and forming patterns respectively corresponding to the regions on the mask, and further adjusting, when the patterns are to be transferred onto the radiation-sensitive substrate, the transfer positions of images of the patterns corresponding to the regions so that the divided regions are combined together to form the exposed pattern element on the radiation-sensitive substrate.

14 Claims, 5 Drawing Sheets

Fig. 1(a)
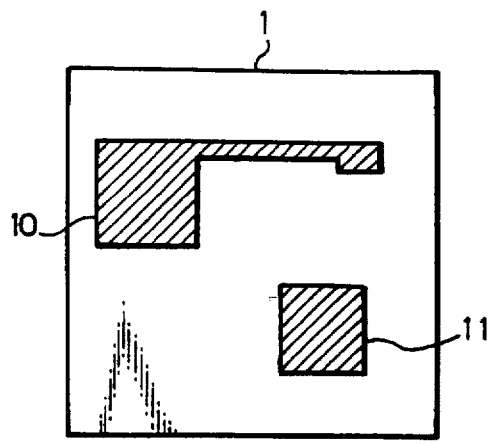
Fig. 1(b)
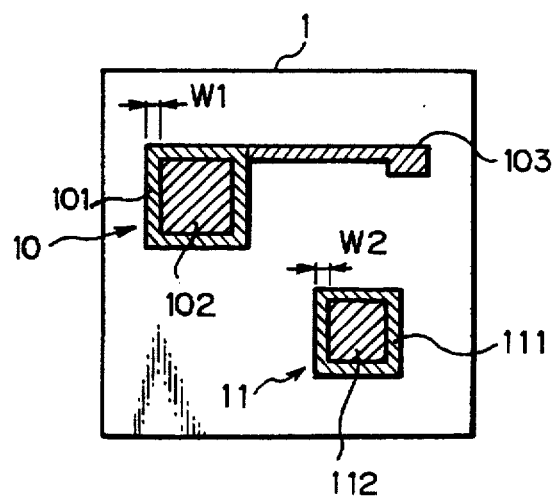
Fig. 1(c)
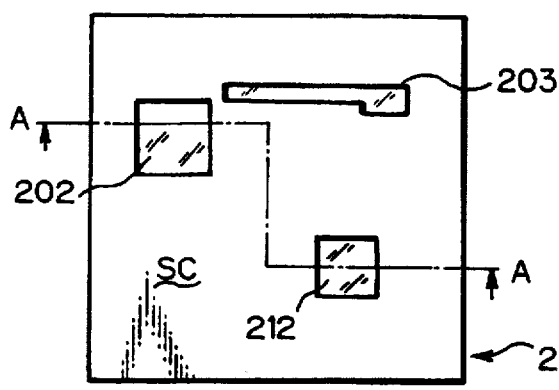
Fig. 1(e)
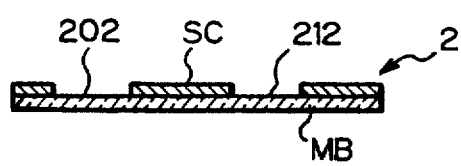
Fig. 1(d)
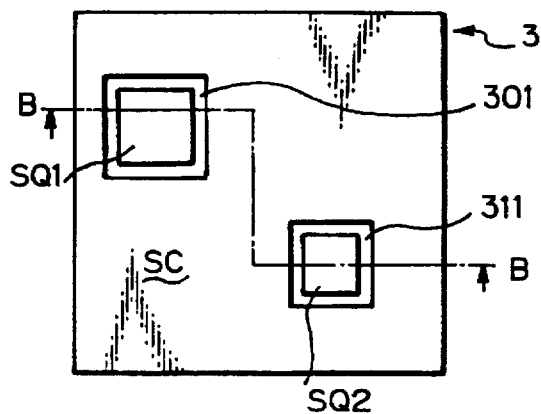
Fig. 1(f)
Fig. 1(g)
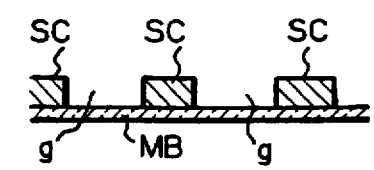

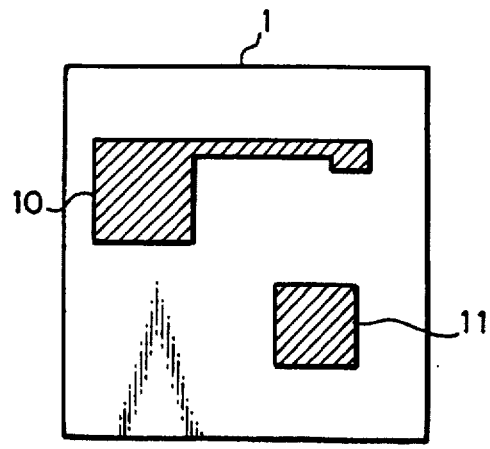
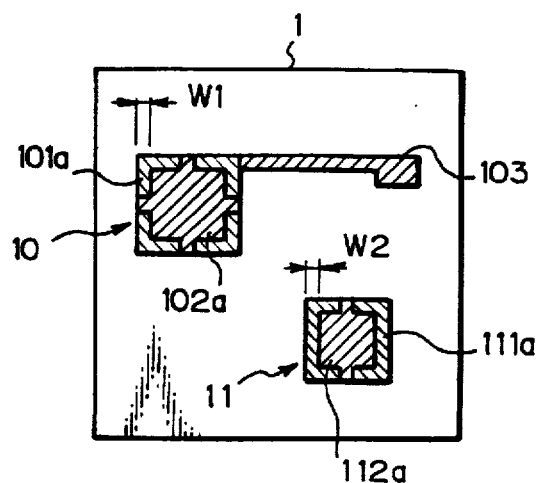
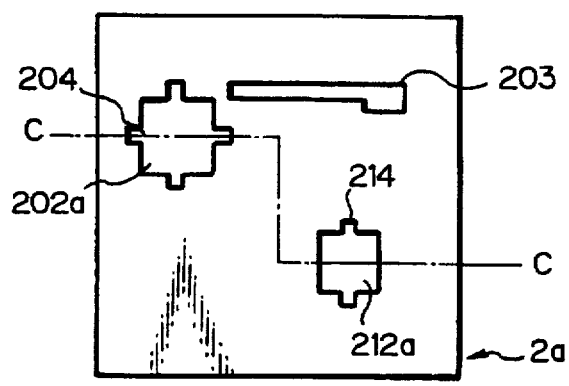
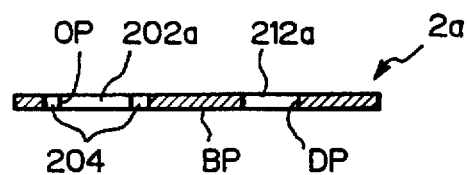
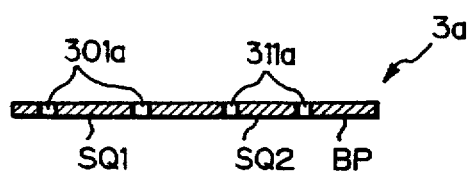
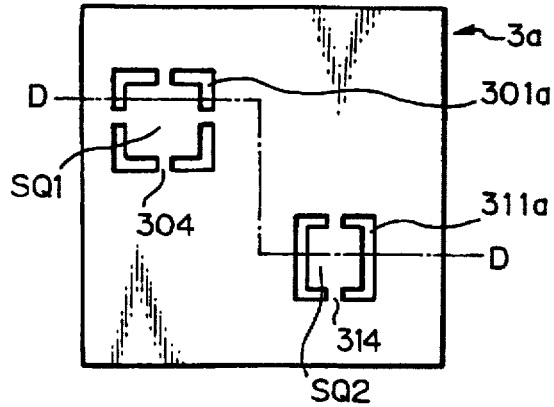
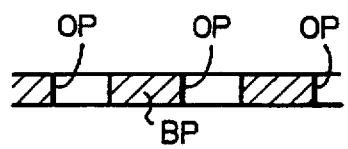

CHARGED PARTICLE BEAM EXPOSURE METHOD AND MASK EMPLOYED THEREFOR

BACKGROUND OF THE INVENTION

1. Field of the Invention

The present invention relates to a charged particle beam exposure method for producing a semiconductor device or the like by using a charged particle beam such as an electron beam or an ion beam, and also to a mask which is suitable for carrying out the exposure method.

2. Related Prior Arts

As a lithography system for printing an integrated circuit pattern on a semiconductor wafer, an optical stepper, which uses light, has heretofore been employed. However, as integrated circuit patterns become finer, the limit of resolution by light beam has become a matter of concern. Under these circumstances, lithography systems that use an electron beam, an ion beam, X-rays, etc. have been investigated and developed. Among these beams, particularly the electron beam is considered to be most practical, and electron beam exposure systems of pencil beam and variable shaped beam types have been proposed and developed.

In the above-described lithography systems using an electron beam, when a substrate, e.g., a silicon wafer, is irradiated with the electron beam, a resist, that is, a radiation-sensitive material, coated on the substrate reacts to the electron beam. The primary electron beam irradiated to the substrate is scattered inside the resist and at the surface of the silicon substrate, and scattered electrons extend over a wider area than the irradiation area of the primary electron beam. Accordingly, the resist reacts to the electron beam not only at the portion irradiated with the primary electron beam but also at the periphery of the irradiated portion. The resist is developed after the irradiation with the electron beam. In this case, if the energy stored in the periphery of the irradiated portion exceeds a predetermined level, a resist film undesirably remains in an area other than the primary electron beam irradiation area after the development (in the case of a negative resist), or a resist film is undesirably removed by the development (in the case of a positive resist). The unintended reaction of the resist gives rise to the following problems: For example, in a case where relatively large exposed pattern elements (each corresponding to the primary electron beam irradiation area) lie on a radiation-sensitive substrate in close proximity to each other with a small gap therebetween, the unintended reaction of the resist causes, after development of the resist, the gap to be destroyed or to become smaller than the design width. Such a phenomenon is called "external proximity effect" because it is an effect produced by a pair of adjacent exposed pattern elements on the outside thereof.

In a case where the dose of electron beam irradiated per unit area of a substrate is constant, a relatively large exposed pattern element is affected by scattered electrons to a larger extent than a relatively small exposed pattern element. Consequently, the electron radiation energy stored per unit area increases as the size of exposed pattern element becomes larger, and the width of the exposed pattern element per se becomes larger than the design width after the development. Since such a phenomenon occurs inside the exposed pattern element, it is called "internal proximity effect". Further, as the beam current passing through the lens barrel of electron optics increases, the effect of repulsion between charged particles becomes stronger. As a result, the degree of blur or unsharpness of the projected image increases. This phenomenon is generally known as "Coulomb effect defocusing".

In use of a pencil beam type or variably formable beam type electron beam exposure system, various methods are carried out in order to correct the above-described proximity effects. The most effective method is the one that is known as "radiation dose correction". When the external proximity effect is to be corrected by this method, a region where exposed pattern elements lie in close proximity to each other is exposed with a smaller radiation dose per unit area than in other regions. Consequently, the amount of energy stored in a non-exposed area (area other than the irradiation area of the primary electron beam) decreases, and it is possible to avoid a reduction of the gap width between a pair of adjacent exposed pattern elements after development. When the internal proximity effect is to be corrected by the radiation dose correction method, the electron radiation dose per unit area for exposure of a relatively large exposed pattern element is set at a value smaller than that for exposure of a relatively small exposed pattern element. By doing so, the amount of stored energy can be made uniform irrespective of the size of exposed pattern elements. Thus, it is possible to avoid an increase in the width of a relatively large exposed pattern element.

In an exposure process that employs a variably formable beam type electron beam exposure system, a single exposed pattern element is divided into a plurality of rectangular smaller pattern elements, and these rectangular pattern elements are successively exposed to obtain a composite exposed pattern element. In this case, if the exposed pattern element is divided so that the area of each smaller pattern element will not become larger than a predetermined area, the beam current supplied in each exposure process (exposure for each smaller pattern element) decreases, and thus the Coulomb effect blur or defocusing can be suppressed. Accordingly, the dimensional accuracy of large exposed pattern elements improves. As described above, the Coulomb effect blur or defocusing can be suppressed by reducing the size of each divided smaller pattern element; this makes it possible to reduce the range of the effect of scattered electrons on the external pattern elements. Consequently, the external proximity effect can be suppressed.

Unlike optical steppers in which each exposed pattern element is transferred by one-shot exposure, the above-described pencil beam type or variably formable beam type electron beam exposure system sequentially draws each exposed pattern element and therefore suffers from low throughput. For this reason, the pencil beam type and variably formable beam type electron beam exposure systems are difficult to use for manufacturing production model wafers from the viewpoint of semiconductor device production cost. Under these circumstances, an electron beam transfer system has recently been developed and examined in which a mask formed with patterns for exposure is used in the same way as in optical steppers, and images of patterns in a predetermined range are simultaneously transferred onto a radiation-sensitive substrate. However, in the transfer method that employs a mask, the electron radiation dose per unit area cannot be varied in the transfer range for each transfer process. Therefore, it is impossible to use the above-described methods for correcting proximity effects and Coulomb effect defocusing.

SUMMARY OF THE INVENTION

An object of the present invention is to provide an improved charged particle beam exposure method in which a mask is used, and yet it is possible to suppress the degradation of dimensional accuracy of exposed pattern elements due to the above-described proximity effects and Coulomb effect blur or defocusing.

Another object of the present invention is provide a mask for use in the above-described charged particle beam exposure method, which is capable of suppressing the degradation of dimensional accuracy of exposed pattern elements due to the above-described proximity effects and Coulomb effect blur or defocusing.

The charged particle beam exposure method of the present invention is a method in which a charged particle beam is applied to a mask to transfer an image of a pattern formed on the mask onto a radiation-sensitive substrate. In the method, one exposed pattern element which is to be formed on the radiation-sensitive substrate is divided into a plurality of regions including a peripheral region lying at a marginal portion thereof and at least one inner region lying inside the marginal portion, and a plurality of patterns respectively corresponding to these regions are formed on the mask. When the patterns are to be transferred onto the radiation-sensitive substrate, the transfer positions of images of the patterns corresponding to the regions are adjusted so that the divided regions are combined together to form the exposed pattern element on the radiation-sensitive substrate.

In the above-described charged particle beam exposure method, the dose of charged particle beam applied per unit area of the radiation-sensitive substrate in the step of transferring an image of the pattern corresponding to the peripheral region of the exposed pattern element may differ from that in the step of transferring an image of the pattern corresponding to the at least one inner region of the exposed pattern element.

In the above-described charged particle beam exposure method, the dose of charged particle beam applied per unit area of the radiation-sensitive substrate in the step of transferring an image of the pattern corresponding to the at least one inner region of the exposed pattern element may be set at a value smaller than that in the step of transferring an image of the pattern corresponding to the peripheral region of the exposed pattern element.

Further, in the above-described charged particle beam exposure method, the width of the peripheral region may be varied on the basis of the size of the exposed pattern element obtained by combining together the peripheral region and the at least one inner region so that, when the size of the exposed pattern element is larger than a predetermined value, the width of the peripheral region is relatively large, whereas, when the size of the exposed pattern element is smaller than a predetermined value, the width of the peripheral region is relatively small.

The mask of the present invention, which is used in the charged particle beam exposure method, is capable of forming a charged particle beam applied thereto into a shape corresponding to an exposed pattern element to be formed on a radiation-sensitive substrate. The mask has a peripheral pattern for exposing a marginal portion of one exposed pattern element to be formed on the radiation-sensitive substrate, and at least one inner pattern for exposing a region lying inside the marginal portion of the exposed pattern element.

In the above-described mask, the width of the peripheral pattern may be varied on the basis of the size of the exposed pattern element obtained by combining together an image of the peripheral pattern for exposing the marginal portion of the exposed pattern element and an image of the at least one inner pattern so that, when the size of the exposed pattern element is larger than a predetermined value, the width of the peripheral pattern is relatively large, whereas, when the size of the exposed pattern element is smaller than a predetermined value, the width of the peripheral pattern is relatively small.

In the method of the present invention, one exposed pattern element can be exposed in sequential steps respectively carried out for a peripheral region lying at a marginal portion thereof and for at least one inner region lying inside the peripheral region. Accordingly, the dose of charge particle beam irradiated to expose the peripheral region can be reduced, and it is possible to suppress the phenomenon that the width of the exposed pattern element undesirably increases owing to the Coulomb effect blur or defocusing.

Although energy is stored in the peripheral region by the internal proximity effect produced when the inner region is exposed, if the amount of energy stored in the peripheral region is rationalized by varying the dose of charged particle beam irradiated per unit area to expose the peripheral region from the dose of charged particle beam irradiated to expose the inner region according to the amount of energy stored in the peripheral region during the exposure of the inner region, it is possible to suppress the phenomenon so that the marginal portion of the exposed pattern element is caused to increase in width by the internal proximity effect. In a case where two exposed pattern elements lie adjacent to each other with a small gap therebetween (as shown in FIG. 3(a)), peripheral and inner regions may be set such that marginal portions which lie adjacent to each other with the gap therebetween are defined as peripheral regions, and outer portions of the exposed pattern elements which lie outside the peripheral regions (which may include marginal portions excluded from the peripheral regions) are defined as inner regions. In this case also, energy is stored in the peripheral regions during exposure of the inner regions. However, if the amount of energy stored in the peripheral regions is rationalized by varying the dose of charged particle beam irradiated per unit area to expose the peripheral regions from the dose of charged particle beam irradiated to expose the inner regions according to the amount of energy stored in the peripheral regions during the exposure of the inner regions, it is possible to suppress the phenomenon that the gap is caused to reduce in width by the external proximity effect. In addition, the beam current supplied to expose the peripheral regions can be reduced (in both the cases shown in FIGS. 1(a) and 3(a)), and thus the Coulomb effect defocusing can be suppressed.

Further, according to the method of the present invention, it is possible to minimize the dose of charged particle beam irradiated per unit area to expose the marginal portion of each individual exposed pattern element, and hence possible to suppress the degradation of dimensional accuracy of the exposed pattern element due to the proximity effects and the Coulomb effect defocusing.

When the exposed pattern element obtained by combining together the peripheral and inner regions is large, the internal proximity effect is also large. However, according to the method of the present invention, the width of the peripheral region corresponding to the marginal portion is also set at a correspondingly large value. Accordingly, the dose of charged particle beam applied per unit area is reduced over a wider range. Thus, it is possible to surely suppress the phenomenon that the marginal portion of the exposed pattern element undesirably increases in width.

According to the mask of the present invention, one exposed pattern element can be exposed in sequential steps respectively carried out for a marginal portion thereof and an inner portion thereof which lies inside the peripheral region by transferring an image of the peripheral pattern and an image of the inner pattern onto the radiation-sensitive substrate separately from each other. When the exposed pattern element which is obtained by combining together with the image of the peripheral pattern and the image of the inner pattern is large in size, the internal proximity effect is also large. However, since the width of the peripheral pattern for exposing the marginal portion is set at a corresponding large value, the radiation dose of charged particle beam is reduced over a wider range. Thus, it is possible to surely suppress the phenomenon that the marginal portion of the exposed pattern element undesirably increases in width.

BRIEF DESCRIPTION OF THE DRAWINGS

FIGS. 1(a) to 1(d) are views illustrating a first embodiment of the charged particle beam exposure method according to the present invention, in which, FIG. 1(a) shows exposed pattern elements on a radiation-sensitive substrate, FIG. 1(b) shows the way in which each exposed pattern element is divided into a plurality of smaller regions, FIG. 1(c) shows a mask for exposing some portions of the exposed pattern elements, FIG. 1(d) shows a mask for exposing the remaining portions of the exposed pattern elements, FIG. 1(e) shows a cross-sectional view taken along line A—A in FIG. 1(c), FIG. 1(f) shows a cross-sectional view taken along line B—B in FIG. 1(d) and FIG. 1(g) shows a cross-sectional view illustrating a method for forming the mask.

FIGS. 2(a) to 2(g) are views illustrating a modified example of the first embodiment of the charge particle beam exposure method according to the present invention, in which FIG. 2(a) shows exposed pattern elements on a radiation-sensitive substrate, FIG. 2(b) shows the way in which each exposed pattern element is divided into a plurality of smaller regions, FIG. 2(c) shows a mask for exposing some portions of the exposed pattern elements, FIG. 2(d) shows a mask for exposing the remaining portions of the exposed pattern elements, FIG. 2(e) shows a cross-sectional view taken along line C—C in FIG. 2(c), FIG. 2(f) shows a cross-sectional view taken along line D—D in FIG. 2(d) and FIG. 2(g) shows a cross-sectional view illustrating a method for forming the mask of the modified example.

FIGS. 3(a) to 3(d) are views illustrating a second embodiment of the charged particle beam exposure method according to the present invention, in which, FIG. 3(a) shows exposed pattern elements on a radiation-sensitive substrate, FIG. 3(b) shows the way in which each exposed pattern element is divided into a plurality of smaller regions, FIG. 3(c) shows a mask for exposing some portions of the exposed pattern elements, and FIG. 3(d) shows a mask for exposing the remaining portions of the exposed pattern elements.

DESCRIPTION OF THE PREFERRED EMBODIMENTS

First Embodiment

Figure 3A:
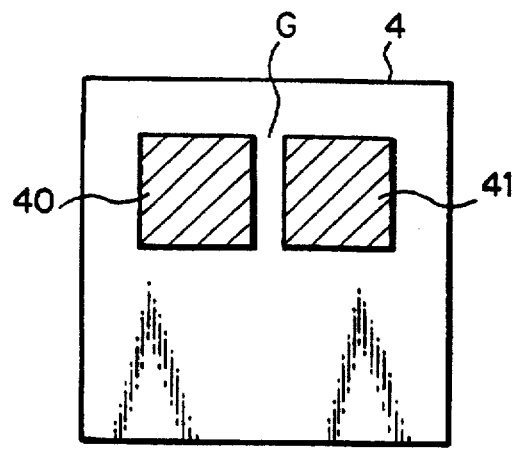

A first embodiment of the present invention will be described below with reference to FIGS. 1(a) to 1(g). In this embodiment, as shown in FIG. 1(a), two exposed pattern elements 10 and 11 (the hatched regions in FIG. 1(a)) are exposed separately onto a radiation-sensitive substrate 1 by using two masks 2 and 3, shown in FIGS. 1(c) to 1(g) FIG. 1(b) shows the way in which the exposed pattern elements 10 and 11 are each divided into a plurality of smaller regions. The exposed pattern element 10 is divided into a first region 101, a second region 102, and a third region 103. The exposed pattern element 11 is divided into a first region 111, and a second region 112. The first region 101 defines a part of the marginal or peripheral portion of the exposed pattern element 10 before it is divided. The first region 111 is the whole of the marginal portion of the exposed pattern element 11. The second regions 102 and 112 are rectangular exposed portions which are surrounded by the first regions 101 and 111, respectively. The widths w1 and w2 of the first regions 101 and 111 are uniform over their entire circumferences. The width w1 of the first region 101 is greater than the width w2 of the first region 111 (w1>w2). The reason for this is that an exposed pattern element which is obtained by combining together the first region 101 and the second region 102 is larger than the exposed pattern element 11, and therefore the internal proximity effect produced when the second region 102 is exposed is larger than that produced during the exposure of the second region 112. It should be noted that the size comparison between exposed pattern elements is made by comparing the size of the area of figures similar to the relevant exposed pattern elements or exposed pattern elements close to them.

As shown in FIG. 1(c), the mask 2 is formed with second patterns 202 and 212 respectively corresponding to the second regions 102 and 112 of the exposed pattern elements 10 and 11, and a third pattern 203 corresponding to the third region 103 of the exposed pattern element 10. FIG. 1(e) is a cross-sectional view taken along line A—A of the mask 2. As shown in FIG. 1(d), the mask 3 is formed with first patterns 301 and 311 respectively corresponding to the first regions 101 and 111 of the exposed pattern elements 10 and 11. FIG. 1(f) is a cross-sectional view taken along line B—B of the mask 3. These masks 2 and 3 may be formed, as shown, for example, in FIG. 1(g), by disposing scattering members SC having a relatively large scattering angle to an electron beam on a thin base plate or membrane MB which has high transmissivity to an electron beam. In this case the scattering members SC are disposed so that the configurations of gap portions g between the scattering members SC in plan view (i.e., the configurations of the gap portions g as viewed from the top of FIG. 1(g)) coincide with the first patterns 301 and 311, the second patterns 202 and 212 and the third pattern 203. Further, if the masks are used in a transcribing apparatus in which the image of the scattering member SC is transcribed onto a radiation-sensitive substrate, the same effects as described above are attained by disposing the scattering member SC so that the configuration of the member and each pattern are the same.

FIGS. 2(a) to 2(g) shows a modified example of the first embodiment. The contents shown in FIGS. 2(a) and 2(b) are the same as those shown in FIGS. 1(a) and 1(b) and, therefore, explanation regarding the FIGS. 2(a) and 2(b) is omitted herein. In this modified embodiment, masks 2a and 3a may be formed by perforating an opening or slit OP in the base plate BP made of material which has non- or less-transmissivity to an electron beam or scatters the electron beam. As shown in FIG. 2(c), the mask 2a is formed with the second patterns 202a, 212a respectively corresponding to the second regions 102a and 112a of the exposed pattern elements 10 and 11, and a third pattern 203 corresponding to the third region 103 of the exposed pattern element 10. As shown in FIG. 2(d), the mask 3a is formed with the first patterns 301a and 311a respectively corresponding to the first regions 101a and 111a of the exposed pattern elements 10 and 11. In this case, the opening or slit OP is formed so that the configurations in a plane view of the opening coincide with the first patterns 301a and 311a, the second patterns 202a and 212a and the third pattern 203. In this modified example, preferably, the second pattern 202a of the mask 2a has a configuration in which recessed portions 204 are formed at substantially the center of each of four edges or sides of a rectangular opening, and the second pattern 212a has a configuration in which recessed portions 214 are formed at substantially the center of upper and lower (in FIG. 2(c)) edges or sides of another rectangular opening. It is also preferable that the first pattern 301a of the mask 3a has a configuration in which support portions 304 corresponding to the recessed portions 204 are formed at substantially the center of each of four sections or portions of a rectangular frame-like opening, and the first pattern 311a has a configuration in which support portions 314 corresponding to the recessed portions 214 are formed at substantially the center of the upper and lower sections or portions of another rectangular frame-like opening. The reason for this is that in the case where the mask 3a is structured by forming the opening in the base plate BP, if the first patterns 301a, 311a are formed as a rectangular frame-like opening the rectangular portions or sections (respectively corresponding to the second patterns 202, 212) SQ1 and SQ2 which are defined inside the first patterns 301a, 311a are separated from the peripheral portion by the opening or slit OP constituting the first pattern. Since the rectangular portion SQ1 and the portion defined outside the first pattern 301a are connected to each other by the support portions 304 and the rectangular portion SQ2, and the portion defined outside the first pattern 311a are connected to each other by the support portions 314, the rectangular portions are not separated from a mask body. Unexposed portions caused by the supporting portions 304, 314 formed in the mask 3a are exposed by the recessed portions 204, 214 of the second patterns 202a, 211a formed in the mask 2a.

In an actual exposure process of the first embodiment, the patterns are transferred from the masks 2 and 3 or 2a and 3a to the radiation-sensitive substrate 1 in an appropriate reduction ratio (e.g., ¼). Therefore, the patterns of the masks 2 and 3 or 2a and 3a are larger than the exposure pattern elements on the radiation-sensitive substrate 1 by the reciprocal times of the reduction ratio. In the drawings, however, the mask patterns are drawn in one-to-one size relation to the exposed pattern elements on the radiation-sensitive substrate 1.

In an exposure process carried out using the above-described masks 2 and 3 (an exposure process carried out by using the masks 2a and 3a are the same as that using masks 2 and 3, and therefore the explanation thereof will be omitted), first, the mask 2 is irradiated with an electron beam to expose the radiation-sensitive substrate 1 at the regions 102, 103 and 112 corresponding to the patterns 202, 203 and 212. The electron beam dose per unit area at this time is set at a value suitable for exposing the third region 103 in a single exposure operation. Next, the mask 3 is irradiated with an electron beam to expose the radiation-sensitive substrate 1 at the regions 101 and 111 corresponding to the patterns 301 and 311. At this time, the transfer positions of the images of the patterns 301 and 311 are adjusted so that the exposed pattern element 10 is composed of the first region 101 and the second and third regions 102 and 103 exposed with the mask 2, and the exposed pattern element 11 is composed of the first region 111 and the second region 112 exposed with the mask 2. Since energy is stored in the first regions 101 and 111 by the internal proximity effect produced when the second regions 102 and 112 are exposed, the dose of electron radiation applied per unit of the mask 3 is reduced correspondingly to the amount of energy stored in the first regions 101 and 111. It should be noted that the exposure carried out with the mask 3 may precede the exposure with the mask 2.

Second Embodiment

Figure 3B:
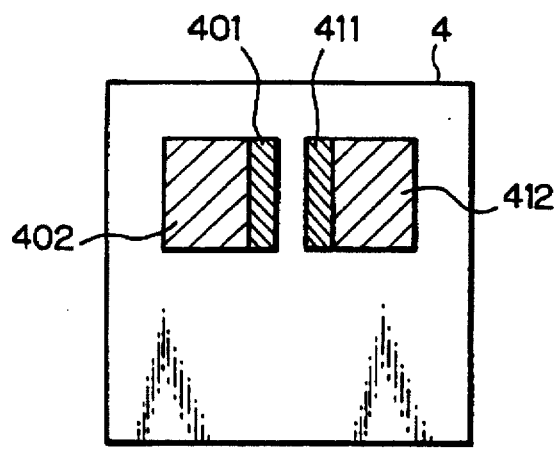
Figure 3C:
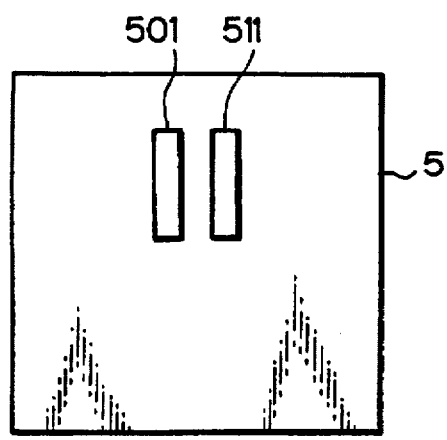
Figure 3D:
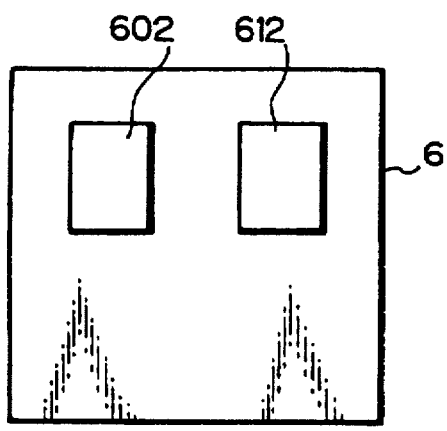

A second embodiment of the present invention will be explained below with reference to FIGS. 3(a) to 3(d). In this embodiment, two rectangular exposed pattern elements 40 and 41 (the hatched regions in FIG. 3(a)) which lie adjacent to each other with a narrow gap G therebetween on a radiation-sensitive substrate 4, as shown in FIG. 3(a), are each divided into a plurality of smaller regions, and these regions are exposed separately by using two masks 5 and 6, shown in FIGS. 3(c) and 3(d). FIG. 3(b) shows the way in which the exposed pattern elements 40 and 41 are each divided into smaller regions. In this embodiment, the exposed pattern elements 40 and 41 are divided into first regions 401 and 411 corresponding to the respective marginal or side portions which face each other across the gap G, and second regions 402 and 412 corresponding to all the remaining exposed regions, exclusive of the first regions 401 and 411. The mask 5 is formed with first patterns 501 and 511 for exposing the first regions 401 and 411, and the mask 6 is formed with second patterns 602 and 612 for exposing the second regions 402 and 412. The pattern forming method is the same as that in the first embodiment.

In this embodiment also, the transfer positions of pattern images of the masks 5 and 6 are adjusted so that the exposed pattern elements 40 and 41 are obtained from respective combinations of the first regions 401 and 411 formed on the radiation-sensitive substrate 4 in correspondence with the first patterns 501 and 511 of the mask 5 and the second regions 402 and 412 formed on the radiation-sensitive substrate 4 in correspondence with the second patterns 602 and 612 of the mask 6. In exposure with the mask 6, the dose of electron beam applied per unit area of the radiation-sensitive substrate 4 is set at a value equal to the electron beam radiation dose required to expose the exposed pattern elements 40 and 41 in one exposing operation. In exposure with the mask 5, since the energy has also been stored in the first regions 401 and 411 during the exposure carried out with the mask 6, the electron beam radiation dose per unit area is reduced correspondingly to the amount of energy stored in the first regions 401 and 411.

Third Embodiment

Figure 4:
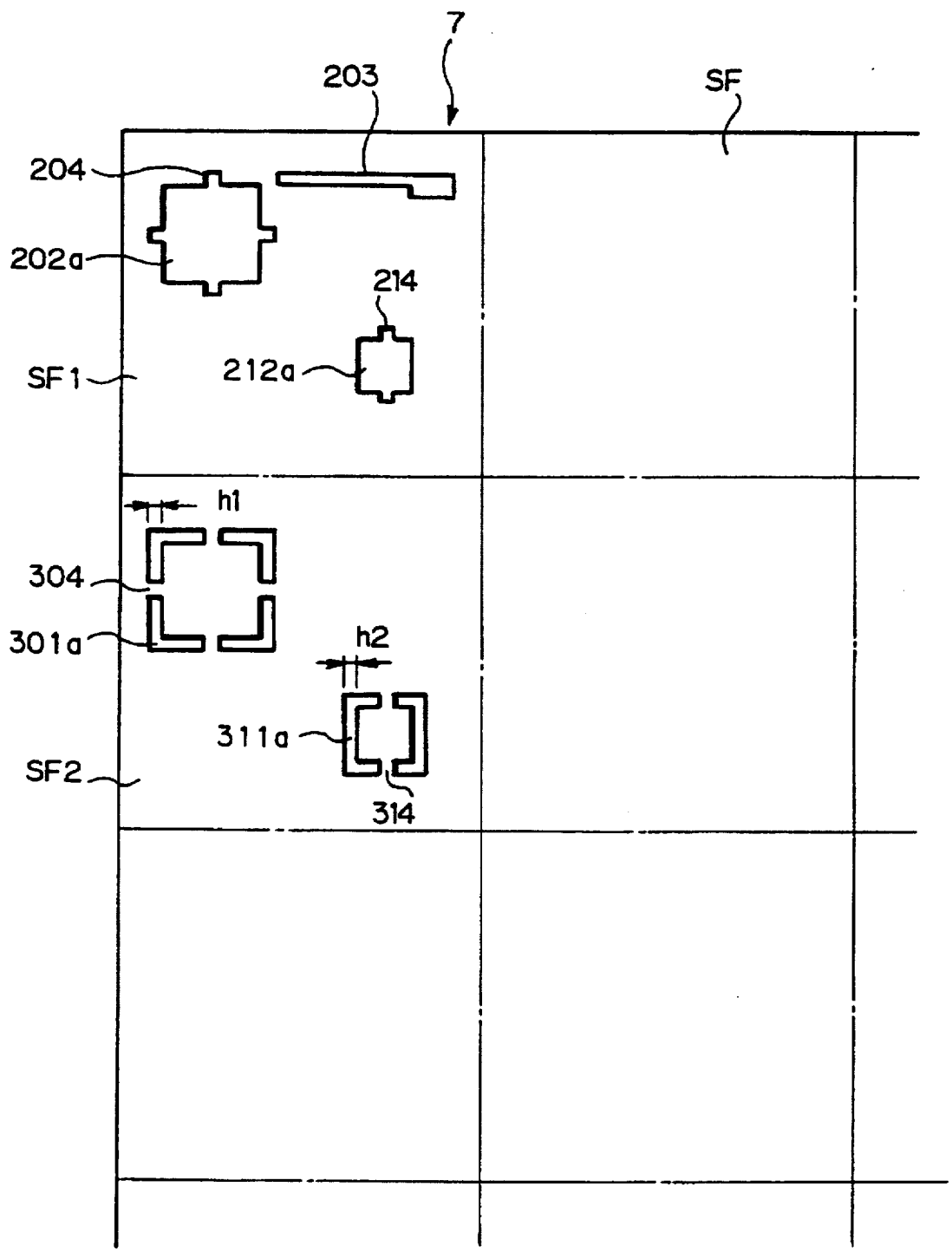
FIG. 4 shows a mask used in a third embodiment of the charged particle beam exposure method according to the present invention.
Figure 5:
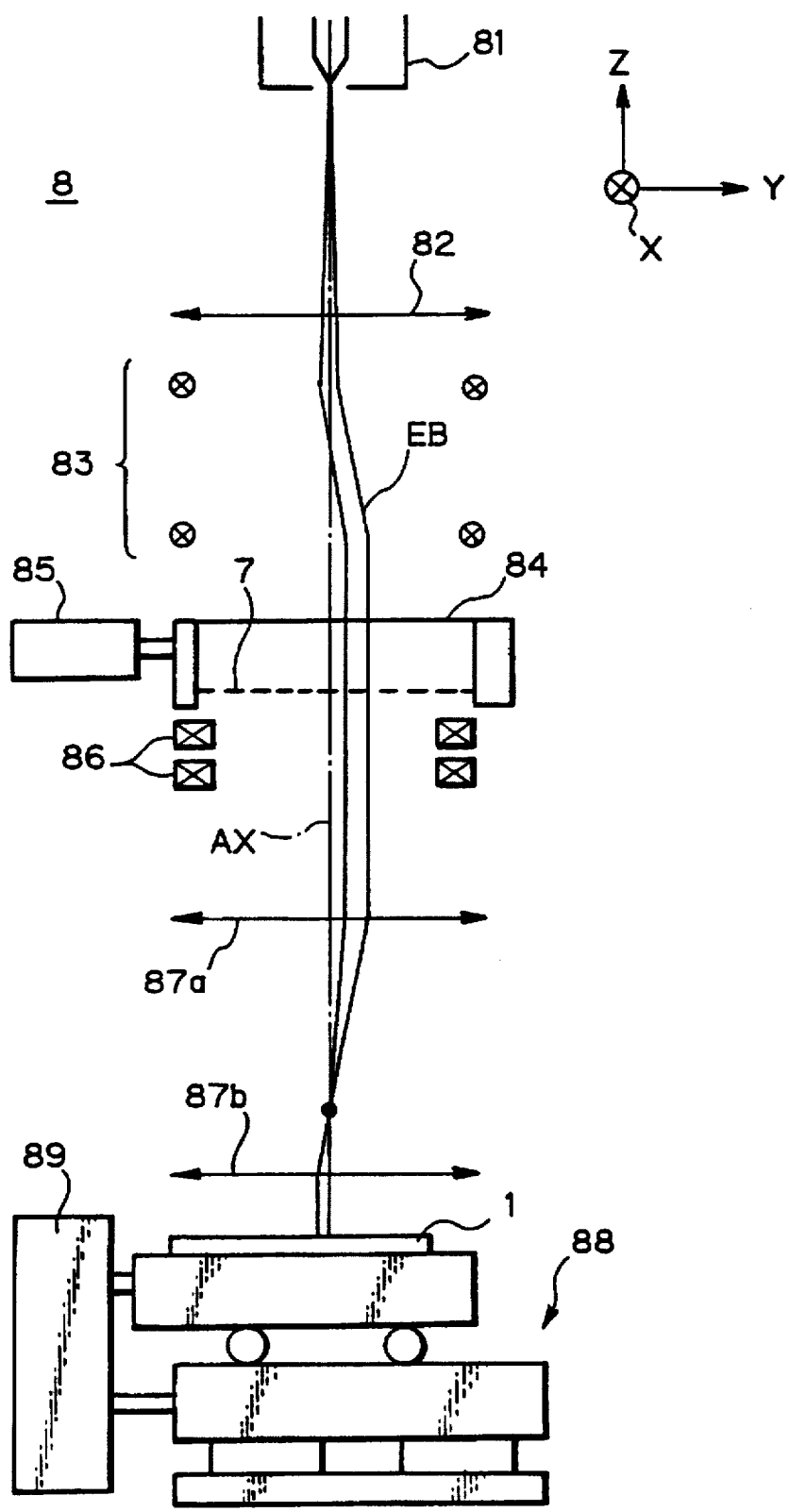
FIG. 5 schematically shows an electron beam transfer system used in the third embodiment.

A third embodiment of the present invention will be explained below with reference to FIGS. 4 and 5. It should be noted that, since in this embodiment the same exposed pattern elements as those in the first embodiment are formed, illustration thereof is omitted. For the details of the exposed pattern elements on the radiation-sensitive substrate, see FIGS. 2(a) and 2(b). In FIGS. 4 and 5, portions common to the first embodiment (shown in FIGS. 2(a) to 2(g)) and this embodiment are denoted by the same reference numerals.

As shown in FIG. 4, in this embodiment, first patterns 301a and 311a, second patterns 202a and 212a and a third pattern 203, which are used to expose exposed pattern elements 10 and 11 in two steps, are formed on a single mask 7. As shown by phantom lines in the figure, the mask 7 is divided both lengthwise and breadth wise into a plurality of rectangular subdivided fields SF. In one subdivided field SF1, the second patterns 202a and 212a and the third pattern 203 are formed, and in another subdivided field SF2, the first patterns 301a and 311a are formed. It should be noted that the boundary portions between the subdivided fields SF are formed from a material which scatters electron beams like the scattering members SC shown in FIG. 1(g) or from a material which intercepts or scatters electron beams like the base plate BP shown in FIG. 2(g). The width h1 of the first pattern 301a is set at a value larger than the width h2 of the first pattern 311a (h1>h2) in correspondence with the size relationship between the widths w1 and w2 of the first regions 101a and 111a of the exposed pattern elements 10 and 11.

FIG. 5 schematically shows an electron beam transfer system in which the above-described mask 7 may be used. In the transfer system 8 shown in FIG. 5, an electron gun 81 emits an electron beam EB, and a condenser lens 82 shapes the electron beam EB into a parallel beam. A field selecting deflector 83 is adapted to select an incident position of the electron beam EB with respect to the mask 7. A mask stage 84 holds the mask 7. An actuator 85 causes the mask stage 84 to move in a direction parallel to an X-axis shown in the figure (i.e., a direction perpendicularly intersecting the plane of the figure) and also in a direction parallel to a Y-axis. The electron beam EB that is to be led to the mask 7 is formed by an aperture (not shown) into such a shape and a size that it can irradiate one subdivided field SF of the mask 7 by one shot. A position correction deflector 86 adjusts the transfer position of a pattern image with respect to the radiation-sensitive substrate 1 in the XY-plane. Projection lenses 87a and 87b are adapted to project a pattern image of the mask 7 onto the radiation-sensitive substrate 1 in a predetermined demagnification ratio (e.g., ¼). The radiation-sensitive substrate 1 is placed on a wafer stage 88. An actuator 89 causes the wafer stage 88 to move in both the X- and Y-axis directions. It should be noted that the direction of a Z-axis shown in the figure coincides with the direction of an optical axis AX of the electron gun 81.

In transfer process carried out by the above-described electron beam transfer system 8, the mask 7 is fitted on the mask stage 84 in such a manner that the directions in which the subdivided fields SF are arranged (the lengthwise and breadthwise directions in FIG. 4) are coincident with the directions of the X- and Y-axes. By the combination of the movement of the mask 7 by the mask stage 84 with the deflection of the electron beam EB by the field selecting deflector 83, the subdivided fields SF of the mask 7 are stepwisely scanned with the electron beam EB, and images of the patterns formed on the mask 7 are collectively transferred onto the radiation-sensitive substrate 1 for each subdivided field SF. The pattern image transfer position with respect to the radiation-sensitive substrate 1 is adjusted by the movement of the radiation-sensitive substrate 1 by the wafer stage 88 and the deflection of the electron beam EB by the position correction deflector 86. In the step of transferring the patterns 202a, 203a and 212a in the subdivided field SF1 and in the step of transferring the patterns 301a and 311a in the subdivided field SF2, the pattern transfer position is adjusted so that the exposed pattern element 10 is composed of the exposed portions of the radiation-sensitive substrate 1 respectively corresponding to the patterns 202a, 203a and 301a, and the exposed pattern element 11 is composed of the exposed portions of the radiation-sensitive substrate 1 respectively corresponding to the patterns 212a and 311a. The dose of electron beam irradiated per unit area to transfer the patterns in the subdivided field SF1 is set at a value equal to the dose of electron beam applied when the exposed pattern elements 10 and 11 are not divided. During the transfer of the patterns in the subdivided field SF1, energy is also stored in regions to which the patterns in the subdivided field SF2 are to be transferred by the internal proximity effect. Therefore, the dose of electron beam applied per unit area to transfer the patterns in the subdivided field SF2 is set at a value reduced correspondingly to the amount of energy stored in those regions.

It should be noted that the position correction deflector 86 is originally adapted to deflect the electron beam passing through the mask 7 by an amount corresponding to the width of the boundary portion between a pair of adjacent subdivided fields SF to thereby connect together patterns divided for each subdivided field SF on the radiation-sensitive substrate 1. Therefore, a deflector which is separate from the position correction deflector 86 may be provided for transferring the images of the patterns in the two subdivided fields SF1 and SF2 onto the same position on the radiation-sensitive substrate 1.

Although in the foregoing embodiments one exposed pattern element is exposed in two steps, exposure for one exposed pattern element may be carried out in three or more steps. In such a case, the distribution of charged particle beam energy stored in the exposed pattern element from the inner, or central portion to the marginal portion thereof can be controlled even more finely. In the foregoing embodiments, the exposed pattern elements on the radiation-sensitive substrate and the mask patterns schematically represent actual integrated circuit patterns. In actual practice, a large number of pattern elements in the order of μm are provided. The first region and the first pattern need not be completely similar to each other, nor need the second region and the second pattern. That is, when images of the first and second patterns are transferred onto the radiation-sensitive substrate, there may be a gap or an overlap between the two images. Further, in the described embodiments, the dose of electron beam applied or irradiated per unit area to transfer the pattern corresponding to the inner portion is set at a value equal to the electron beam radiation dose applied when the exposed pattern element is not divided. In general, however, the two electron beam radiation doses are not necessarily equal to each other. It should be noted that the term "the radiation dose per unit area" herein used is employed to mean the quantity of electron beam applied per unit area in a predetermined time.

As has been described above, the charged particle beam exposure method and mask of the present invention make it possible to expose one exposed pattern element in sequential steps respectively carried out for a marginal or peripheral portion thereof and an inner portion thereof which lies inside the marginal portion. Accordingly, it is possible to suppress the phenomenon that the marginal portion of the exposed pattern element undesirably increases in width, and hence it is possible to improve the exposure accuracy. In particular, by varying the dose of charged particle beam applied or irradiated per unit area of the radiation-sensitive substrate in the step of transferring the marginal portion of the exposed pattern element from that in the step of transferring the other portion of the exposed pattern element, the proximity effects and the Coulomb effect defocusing can be effectively suppressed. Further, the charged particle beam transfer method and mask of the present invention enable the internal proximity effect to be appropriately corrected according to the size of the exposed pattern element.

What is claimed is:

1. A charged particle beam exposure method in which a charged particle beam is irradiated to a mask to transfer an image of a pattern formed on the mask onto a radiation-sensitive substrate, said method comprising:

dividing one exposed pattern element which is to be formed on said radiation-sensitive substrate into a plurality of regions including a peripheral region lying at a marginal portion of the exposed pattern element and at least one inner region lying inside said peripheral region, and forming a plurality of patterns respectively corresponding to said regions on said mask; and adjusting, when the patterns are to be transferred onto said radiation-sensitive substrate, transfer positions of images of the patterns corresponding to said regions so that said regions are combined together to form said one exposed pattern element on said radiation-sensitive substrate.

2. A charged particle beam exposure method according to claim 1, wherein a dose of charged particle beam irradiated per unit area of said radiation-sensitive substrate in a step of transferring an image of the pattern corresponding to said peripheral region of said exposed pattern element differs from that in a step of transferring an image of the pattern corresponding to said at least one inner region of said exposed pattern element.

3. A charged particle beam exposure method according to claim 2, wherein the dose of charged particle beam irradiated per unit area of said rasuation-sensitive substrate in the step of transferring an image of the pattern corresponding to said at least one inner region of said exposed pattern element is smaller than that in the step of transferring an image of the pattern corresponding to said peripheral region of said exposed pattern element.

4. A charged particle beam exposure method according to claim 1, wherein a width of said peripheral region is varied on the basis of a size of said exposed pattern element obtained by combining together said peripheral region and said at least one inner region so that, when the size of said exposed pattern element is larger than a predetermined value, the width of said peripheral region is relatively large, whereas, when the size of said exposed pattern element is smaller than a predetermined value, the width of said peripheral region is relatively small.

5. A charged particle beam exposure method according to claim 1, wherein said patterns are formed on different masks, respectively.

6. A charged particle beam exposure method according to claim 1, wherein said patterns are formed in different regions, respectively, on a single mask.

7. A mask which is capable of forming a charged particle beam irradiated thereto into a shape corresponding to an exposed pattern element to be formed on a radiation-sensitive substrate, said mask comprising:

a peripheral pattern for exposing a marginal portion of one exposed pattern element to be formed on said radiation-sensitive substrate; and at least one inner pattern for exposing a region inside said marginal portion of said one exposed pattern element.

8. A mask according to claim 7, wherein a width of said peripheral pattern is varied on the basis of a size of said exposed pattern element obtained by combining together an image of said peripheral pattern for exposing the marginal portion of said exposed pattern element and an image of said at least one inner pattern so that, when the size of said exposed pattern element is larger than a predetermined value, the width of said peripheral pattern is relatively large, whereas, when the size of said exposed pattern element is smaller than a predetermined value, the width of said peripheral pattern is relatively small.

9. A mask according to claim 7, including a base member which transmits said particle beam, and a membrane attached to said base member to define said patterns, said membrane being formed of a material which does not transmit or scatter said particle beam.

10. A mask according to claim 7, including a base member made of a material which does not transmit or scatter said particle beam, said patterns being cut out in said base member to transmit said particle beam.

11. A charged particle beam exposure method in which a charged particle beam is irradiated to a mask to transfer an image of a pattern formed on the mask onto a radiation-sensitive substrate including:

a first step of irradiating the charged particle beam to a first mask having a first mask pattern formed thereon, said first mask pattern corresponding to a peripheral portion of a predetermined region to be exposed on said radiation-sensitive substrate; and a second step of irradiating a charged particle beam having an energy greater than that of the charged particle beam irradiated in said first step to a second mask having a second mask pattern formed thereon, said second mask pattern corresponding to an inner portion lying inside said peripheral portion of said predetermined region, whereby, said predetermined region on said radiation-sensitive substrate is exposed through said first and second steps.

12. A charged particle beam exposure method according to claim 11, wherein the width of said first mask pattern corresponding to a peripheral region of said predetermined region to be exposed on said radiation-sensitive substrate is determined by the size of said predetermined region.

13. A charged particle beam exposure method in which a charged particle beam is irradiated to a mask to transfer an image of a pattern formed on the mask onto a radiation-sensitive substrate including:

a first step of irradiating the charged particle beam to a first mask pattern formed on said mask and corresponding to a peripheral portion of a predetermined region to be exposed on said radiation-sensitive substrate; and a second step of irradiating a charged particle beam having an energy greater than that of the charged particle beam irradiated in said first step to a second mask pattern formed on said mask at a position which is different from the position at which said first mask pattern is formed and corresponding to an inner portion lying inside said peripheral portion of said predetermined region, whereby, said predetermined region on said radiation-sensitive substrate is exposed through said first and second steps.

14. A charged particle beam exposure method according to claim 13, wherein the width of said first mask pattern corresponding to a peripheral region of said predetermined region to be exposed on said radiation-sensitive substrate is determined by the size of said predetermined region.

* * * * *